(12) United States Patent
Sagara et al.

(10) Patent No.: US 10,168,495 B1
(45) Date of Patent: Jan. 1, 2019

(54) OPTICAL WAVEGUIDE AND OPTICAL CIRCUIT BOARD

(71) Applicant: KYOCERA Corporation, Kyoto-shi, Kyoto (JP)

(72) Inventors: Akifumi Sagara, Moriyama (JP); Ai Iwakura, Amagasaki (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/001,343

(22) Filed: Jun. 6, 2018

(30) Foreign Application Priority Data

Jun. 28, 2017 (JP) .................................. 2017-126064
Jan. 25, 2018 (JP) .................................. 2018/010462

(51) Int. Cl.

| | |
|---|---|
| *G02B 6/42* | (2006.01) |
| *G02B 6/43* | (2006.01) |
| *H05K 1/02* | (2006.01) |
| G02B 6/122 | (2006.01) |
| G02B 6/12 | (2006.01) |
| G02B 6/036 | (2006.01) |

(52) U.S. Cl.
CPC ............. *G02B 6/4214* (2013.01); *G02B 6/43* (2013.01); *H05K 1/0274* (2013.01); *G02B 6/036* (2013.01); *G02B 6/122* (2013.01); *G02B 2006/12104* (2013.01)

(58) Field of Classification Search
CPC ....... G02B 6/4214; G02B 6/43; H05K 1/0274
See application file for complete search history.

(56) References Cited

U.S. PATENT DOCUMENTS

| | | | | |
|---|---|---|---|---|
| 6,438,281 B1 * | 8/2002 | Tsukamoto | ............ | G02B 6/138 385/14 |
| 6,955,481 B2 * | 10/2005 | Colgan | ................ | G02B 6/4214 385/14 |
| 7,263,248 B2 * | 8/2007 | Windover | ............ | H04B 10/801 385/14 |
| 7,596,289 B2 * | 9/2009 | Yamamoto | ......... | G02B 6/12002 385/14 |
| 7,724,989 B2 * | 5/2010 | Kodama | ............ | G02B 6/12002 385/131 |
| 9,310,575 B2 * | 4/2016 | Matsuda | ........... | H01L 31/02327 |
| 9,507,100 B2 * | 11/2016 | Kuo | ....................... | G02B 6/3885 |
| 9,690,046 B2 * | 6/2017 | Terada | ................. | G02B 6/4214 |

(Continued)

FOREIGN PATENT DOCUMENTS

JP 2985791 B2 10/1999

*Primary Examiner* — Jerry Rahll
(74) *Attorney, Agent, or Firm* — Volpe and Koenig, P.C.

(57) ABSTRACT

An optical waveguide includes a laminate including a lower cladding, a core on the lower cladding, and an upper cladding positioned on the lower cladding and covering the core, via holes positioned in the laminate in a spaced opposing relation to each other, a cavity positioned over a span from an upper surface of the upper cladding to the lower cladding, the cavity including a sectional surface sectioning the core obliquely relative to the upper surface of the upper cladding, and a reflective surface positioned in the core and defined by part of the sectional surface, wherein the cavity extends from a region between the via holes in the spaced opposing relation toward the outside of the region, and an opening size of the cavity in the region is smaller than an opening size of the cavity outside the region when viewed in an opposing direction of the via holes.

5 Claims, 8 Drawing Sheets

(56) References Cited

U.S. PATENT DOCUMENTS

| | | | | |
|---|---|---|---|---|
| 9,989,713 B1* | 6/2018 | Cyr | G02B 6/4239 | |
| 10,025,044 B1* | 7/2018 | Masuda | G02B 6/4239 | |
| 2004/0017977 A1* | 1/2004 | Lam | G02B 6/4204 | 385/49 |
| 2004/0160597 A1* | 8/2004 | Tsai | G02B 6/42 | 356/129 |
| 2005/0185880 A1* | 8/2005 | Asai | G02B 6/12002 | 385/14 |
| 2006/0012967 A1* | 1/2006 | Asai | G02B 6/43 | 361/764 |
| 2006/0110114 A1* | 5/2006 | Yanagisawa | G02B 6/136 | 385/129 |
| 2006/0251360 A1* | 11/2006 | Lu | G02B 6/4232 | 385/88 |
| 2006/0263003 A1* | 11/2006 | Asai | G02B 6/4204 | 385/14 |
| 2007/0297729 A1* | 12/2007 | Kodama | G02B 6/42 | 385/94 |
| 2008/0279518 A1* | 11/2008 | Yonekura | G02B 6/42 | 385/127 |
| 2008/0285910 A1* | 11/2008 | Yamada | G02B 6/12002 | 385/14 |
| 2010/0215314 A1* | 8/2010 | Lau | G02B 6/43 | 385/14 |
| 2011/0026878 A1* | 2/2011 | Matsuoka | G02B 6/43 | 385/14 |
| 2011/0299808 A1* | 12/2011 | Matsuoka | G02B 6/4214 | 385/14 |
| 2012/0057822 A1* | 3/2012 | Wu | G02B 6/136 | 385/49 |
| 2012/0213470 A1* | 8/2012 | Matsuoka | G02B 6/4249 | 385/14 |
| 2013/0177274 A1* | 7/2013 | Kosenko | G02B 6/3628 | 385/14 |
| 2013/0177277 A1* | 7/2013 | Fujiwara | G02B 6/4206 | 385/33 |
| 2015/0185426 A1* | 7/2015 | Miao | G02F 1/093 | 385/33 |
| 2015/0355409 A1* | 12/2015 | Yanagisawa | G02B 6/322 | 385/14 |
| 2016/0187582 A1* | 6/2016 | Yanagisawa | G02B 6/138 | 264/1.24 |
| 2016/0202413 A1* | 7/2016 | Choraku | G02B 6/12002 | 385/14 |
| 2017/0123156 A1* | 5/2017 | Yu | G02B 6/4214 | |
| 2017/0207600 A1* | 7/2017 | Klamkin | H01S 5/02292 | |
| 2018/0149815 A1* | 5/2018 | Heroux | G02B 6/43 | |

* cited by examiner

OPTICAL WAVEGUIDE AND OPTICAL CIRCUIT BOARD

BACKGROUND OF THE INVENTION

1. Field of the Invention

The present disclosure relates to an optical waveguide and an optical circuit board including the optical waveguide.

2. Description of the Related Art

Development of a highly-functional optical waveguide capable of transferring a lot of information at high speed and a highly-functional optical circuit board including such an optical waveguide has been progressed with increasing sophistication of electronic devices represented by a server and a supercomputer. The optical waveguide includes a laminate including a lower cladding, a core including a reflective surface, and an upper cladding. For mounting of an optical element to the optical waveguide, the optical waveguide further includes via holes located in the laminate in a spaced state opposing to each other with the core interposed therebetween when viewed in plan. See Japanese Patent No. 2985791.

With the increasing sophistication of electronic devices, downsizing of each optical element has been progressed for the reason that a plurality of optical elements is mounted to the optical waveguide. Corresponding to such a trend, an arrangement interval between the via holes has also been reduced. The above-mentioned reflective surface is positioned just under the optical element and is defined by part of a sectional surface of a cavity spanning from a region between the opposing via holes toward the outside of the region. With a decrease in the arrangement interval between the via holes, however, a difficulty arises in securing a region where the cavity is to be positioned, and in making the optical waveguide adaptable for the downsizing of the optical element. Thus, there is a possibility that it would be difficult to increase the functionality of the optical waveguide.

SUMMARY OF THE INVENTION

An optical waveguide according to the present disclosure includes a laminate including a lower cladding, a core on the lower cladding, and an upper cladding positioned on the lower cladding and covering the core, via holes positioned in the laminate in a spaced opposing relation to each other, a cavity positioned over a span from an upper surface of the upper cladding to the lower cladding, the cavity including a sectional surface sectioning the core obliquely relative to the upper surface of the upper cladding, and a reflective surface positioned in the core and defined by part of the sectional surface, wherein the cavity extends from a region between the via holes in the spaced opposing relation toward the outside of the region, and an opening size of the cavity in the region is smaller than an opening size of the cavity outside the region when viewed in an opposing direction of the via holes.

With the optical waveguide according to the present disclosure, the cavity can be positioned while an arrangement interval between the via holes is reduced. Therefore, a highly-functional optical waveguide can be obtained.

An optical circuit board according to the present disclosure includes the above-described optical waveguide, and a wiring board including pads on a surface of the wiring board at intervals between the pads, wherein the optical waveguide is positioned on the wiring board in a state of the pads being positioned just under lower openings of the via holes.

With the optical circuit board according to the present disclosure, a highly-functional optical circuit board can be obtained because of including the highly-functional optical waveguide constituted as described above.

DESCRIPTION OF THE PREFERRED EMBODIMENTS

Figure 1:
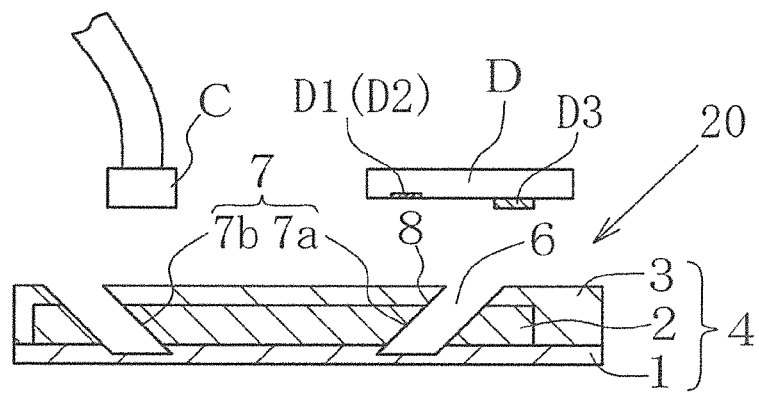
FIG. 1 is a schematic sectional view illustrating an embodiment of an optical waveguide according to the present disclosure.
Figure 2:
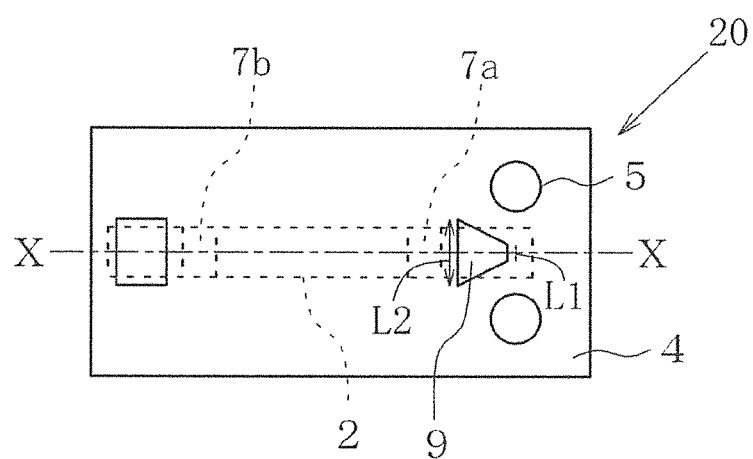
FIG. 2 is a schematic plan view illustrating the embodiment of the optical waveguide according to the present disclosure.

An embodiment of an optical waveguide 20 according to the present disclosure will be described below with reference to FIGS. 1 and 2. FIG. 1 is a sectional view taken along a plane I-I illustrated in FIG. 2. The optical waveguide 20 includes a laminate 4 including a lower cladding 1, a core 2, and an upper cladding 3, via holes 5, a cavity 6, and a reflective surface 7.

The lower cladding 1 has a flat shape with a thickness of 10 to 20 μm, for example. The lower cladding 1 is formed by joining or coating a photosensitive sheet or a photosensitive paste containing an epoxy resin or a polyimide resin, for example, onto or over a substrate, for example, by shaping the joined sheet or the coated paste into a predetermined shape through exposure and development, and then by thermally curing it.

The core 2 has an elongate band-like shape with a rectangular cross-section and a thickness of 20 to 40 μm, for example. The core 2 is formed by joining a photosensitive sheet containing an epoxy resin or a polyimide resin, for example, onto the lower cladding 1 in a vacuum state, by shaping the joined sheet into the band-like shape through exposure and development, and then by thermally curing it. The refractive index of the resin constituting the photosensitive sheet for the core 2 is greater than that of the resin constituting the photosensitive sheet or paste for each of the lower cladding 1 and the upper cladding 3.

The upper cladding 3 is positioned on the lower cladding 1 and covers the core 2. The upper cladding 3 has a thickness of 10 to 20 μm, for example, at a position above the core 2 and includes a flat upper surface. In the upper surface of the upper cladding 3, from the viewpoint of reducing irregular reflection and diffusion of an optical signal, it is advantageous that surface roughness in a region opposing to a light emitting portion D1 or a light receiving portion D2 of an optical element D, described later, is 10 nm or less in terms of arithmetic average roughness Ra. Regarding surface roughness in a region other than the above region, the arithmetic average roughness Ra of 30 to 100 nm is advantageous from the viewpoint of, when the optical waveguide is integrally encapsulated with, e.g., resin in a covering relation to both the optical element D and the upper surface of the upper cladding 3, increasing a contact area between the resin and the upper surface of the upper cladding 3, and increasing adhesion intensity between them. The upper cladding 3 is formed by joining or coating a photosensitive sheet or a photosensitive paste containing an epoxy resin or a polyimide resin, for example, onto or over the lower cladding 1 in a state covering the core 2, by performing exposure and development of the joined sheet or the coated paste, and then by thermally curing it.

The via holes 5 are located in the laminate 4 in a spaced state opposing to each other in a direction perpendicular to an extending direction of the core 2 when viewed in plan. In an example illustrated in FIG. 2, two via holes 5 are opposed to each other in the spaced state with the core 2 interposed therebetween, and a reflective surface 7a is located in the core 2. The two via holes 5 and the reflective surface 7a correspond to arrangement of two electrodes D3 of the optical element D and the light emitting portion D1 or the light receiving portion D2 of the optical element D. More specifically, the optical element D is arranged such that, when viewed in plan, the electrodes D3 overlap the via holes 5 in a one-to-one relation, and the light emitting portion D1 or the light receiving portion D2 overlaps the reflective surface 7a. Distances from the core 2 to the via holes 5 are substantially the same. The via holes 5 penetrate from an upper surface to a lower surface of the laminate 4. In other words, the via holes 5 are positioned over a span from the upper surface of the upper cladding 3 to a lower surface of the lower cladding 1.

The via holes 5 are formed by laser processing or blast processing, for example. Alternatively, the via holes 5 may be formed through exposure and development at the time when the lower cladding 1 and the upper cladding 3 are formed. An opening size of each via hole 5 is set to 50 to 80 μm, for example. An interval between opening centers of the opposing via holes 5 is set to 80 to 110 μm, for example.

The cavity 6 extends from a region between the opposing via holes 5 toward the outside of the region when viewed in plan. The cavity 6 is positioned over a span from the upper surface of the upper cladding 3 to the lower cladding 1, and it includes a sectional surface 8 sectioning the core 2 obliquely relative to the upper surface of the upper cladding 3 when viewed in cross-section.

The cavity 6 includes an opening 9 in the upper surface of the upper cladding 3. An opening size L1 of the cavity 6 in the region between the opposing via holes 5 is smaller than an opening size L2 outside the region. Therefore, the cavity 6 can be positioned in the region between the via holes 5 even when the arrangement interval between the via holes 5 is reduced. The opening size L1 is set to 10 to 40 μm, for example. The opening size L2 is set to 70 to 110 μm, for example. The cavity 6 is formed by laser processing, for example. Surface treatment may be performed on the sectional surface 8 by plasma processing or blast processing, for example.

The reflective surface 7 is located in the core 2. The reflective surface 7 includes, by way of example, a first reflective surface 7a just under the optical element D to be connected to the optical waveguide 20, and a second reflective surface 7b just under a connector C to be connected to the optical waveguide 20. The first reflective surface 7a is constituted by part of the sectional surface 8 of the cavity 6. The reflective surface 7 has the function of changing the direction of an optical signal emitted from the optical element D, and transferring the optical signal to the connector C. Alternatively, the reflective surface 7 has the function of changing the direction of an optical signal sent from the connector C, and causing the optical signal to be received by the optical element D.

A center axis of the core 2 is aligned with a center position of the reflective surface 7, and the optical signal is transferred with the center axis and the center position being a reference. Here, the center axis stands for a position at which a pair of diagonal lines of a rectangular cross-section of the core 2 intersects. The center position stands for a position at which a pair of diagonal lines of the reflective surface 7 having a rectangular shape intersects.

As described above, the optical waveguide 20 according to the present disclosure includes the cavity 6 including the opening 9 in the upper surface of the upper cladding 3. Furthermore, the opening size L1 of the cavity 6 in the region between the opposing via holes 5 is smaller than the opening size L2 outside the region. Thus, even when the arrangement interval between the opposing via holes 5 is small, the cavity 6 can be positioned in the region between the via holes 5, and the optical waveguide 20 can be provided as a highly-functional optical waveguide. Moreover, the opening size L2 outside the region is relatively large, and this point is advantageous in making the reflective surface 7 positioned entirely over the core 2 in a width direction thereof. In that case, a difference between the opening size L1 in the region and the opening size L2 outside the region is set to about 30 to 100 μm, for example.

Figure 3:
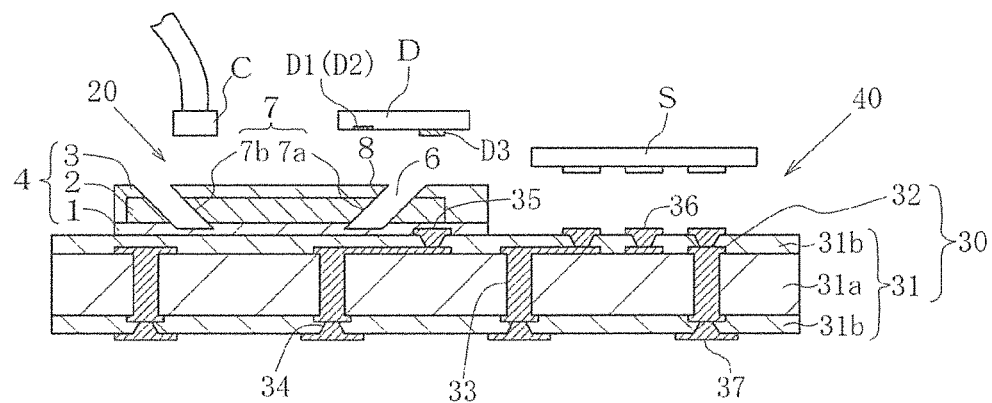
FIG. 3 is a schematic sectional view illustrating an embodiment of an optical circuit board according to the present disclosure.

An embodiment of the optical circuit board 40 including the optical waveguide 20 according to the present disclosure will be described below with reference to FIG. 3. In the following, detailed description of the optical waveguide 20 is omitted.

The optical circuit board 40 includes a wiring board 30 and the optical waveguide 20. The wiring board 30 has the function of fixedly positioning the optical waveguide 20, the optical element D, and the connector C, and electrically connecting the optical element D to the outside (such as a mother board). An optical signal is transferred between the optical element D and the outside (such as an optical device) via the optical waveguide 20. The optical element D may be a vertical cavity surface emitting laser or a photodiode, for example, and may be used for conversion between an optical signal and an electrical signal.

The wiring board 30 includes an insulating substrate 31 and wiring conductors 32. The insulating substrate 31 includes a core insulating layer 31a and buildup insulating layers 31b. The core insulating layer 31a includes a plurality of through-holes 33.

The core insulating layer 31a has the function of, for example, ensuring rigidity of the insulating substrate 31 and holding flatness. The core insulating layer 31a is formed by pressing a semi-hard prepreg made of a glass cloth impregnated with an epoxy resin or a bismaleimide triazine resin, for example, into a flat shape under heating.

The buildup insulating layers 31b include a plurality of via holes 34. The buildup insulating layers 31b have the function of, for example, securing a space for routing the wiring conductors 32 described in detail below, etc. The buildup insulating layers 31b are each formed by bonding a resin film containing an epoxy resin or a polyimide resin, for example, to the core insulating layer 31a under vacuum, and by thermally curing the bonded resin film.

The wiring conductors 32 are positioned on a surface of the core insulating layer 31a, on surfaces of the buildup insulating layers 31b, inside the through-holes 33, and inside the via holes 34. The wiring conductor 32 inside the through-holes 33 establishes electrical continuity between the wiring conductors 32 on the upper and lower surfaces of the core insulating layer 31a. The wiring conductor 32 inside the via holes 34 establishes electrical continuity between the wiring conductor 32 on the surface of one buildup insulating layer 31b and the wiring conductor 32 on the surface of the core insulating layer 31a. The wiring conductors 32 are made of a highly conductive metal, such as a copper plating, formed by a semi-additive process or a subtractive process.

The wiring board 30 includes a plurality of first pads 35 on its upper surface. The first pads 35 are connected to the pads D3 of the optical element D through conductive material such as solders. The wiring board 30 further includes a plurality of second pads 36 on its upper surface and a plurality of third pads 37 on its lower surface. The second pads 36 are connected to an electronic component S such as a semiconductor device, and the third pads 37 are connected to a mother board, for example. The first pads 35, the second pads 36, and the third pads 37 are parts of the wiring conductors 32 and are formed at the same time as when the wiring conductors 32 are formed.

The optical waveguide 20 is positioned on the upper surface of the wiring board 30, the upper surface including a region where the first pads 35 are positioned. The via holes 5 in the optical waveguide 20 include bottom surfaces defined by the first pads 35. The optical waveguide 20 includes the cavity 6 including the opening 9 in the upper surface of the upper cladding 3. The opening size L1 of the cavity 6 in the region between the opposing via holes 5 is smaller than the opening size L2 outside the region. Thus, the cavity 6 can be positioned while the interval between the opposing via holes 5 is reduced. As a result, the functionality of the optical waveguide 20 can be increased.

As described above, since the optical circuit board 40 according to the present disclosure includes the highly-functional optical waveguide 20 on the upper surface of the wiring board 30, the functionality of the optical circuit board can also be increased.

Figure 4:
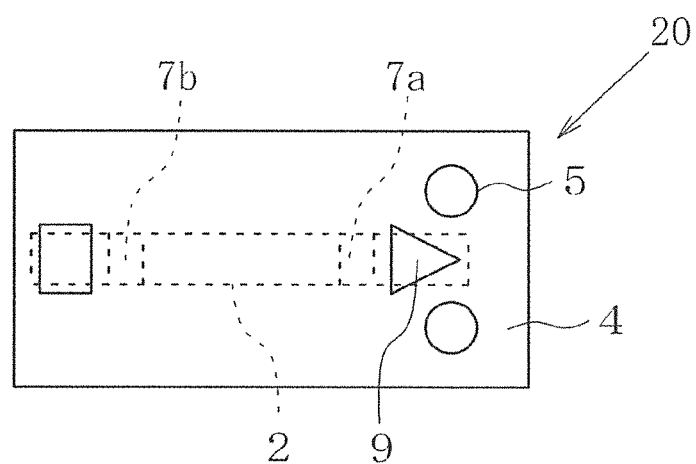
FIG. 4 is a schematic plan view illustrating another embodiment of the optical waveguide according to the present disclosure.

The present disclosure is not limited to the above-described embodiment, and it can be variously modified within the scope not departing from the gist of the present disclosure. For instance, while FIG. 2 illustrates the case in which the opening 9 of the cavity 6 has a trapezoidal shape, the opening 9 may have a triangular shape with one of three apexes being positioned between the opposing via holes 5, as illustrated in FIG. 4. Such a case is advantageous in further reducing a value of the opening size L1 in comparison with that when the opening 9 has the trapezoidal shape, and further reducing the arrangement interval between the via holes 5.

Figure 5:
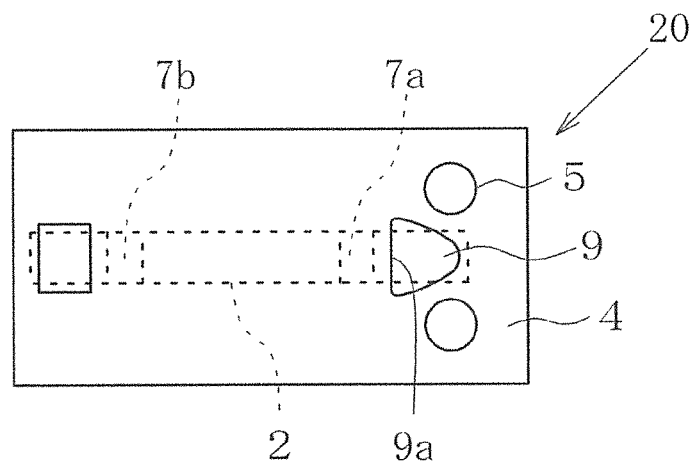
FIG. 5 is a schematic plan view illustrating still another embodiment of the optical waveguide according to the present disclosure.

Furthermore, as illustrated in FIG. 5, sides of the cavity 6 except for an opening side 9a defining one side of the sectional surface 8 may have curved shapes. Such a curved shape is advantageous in increasing workability because narrowing of a region near a corner of the opening 9, for example, is suppressed.

Figure 6:
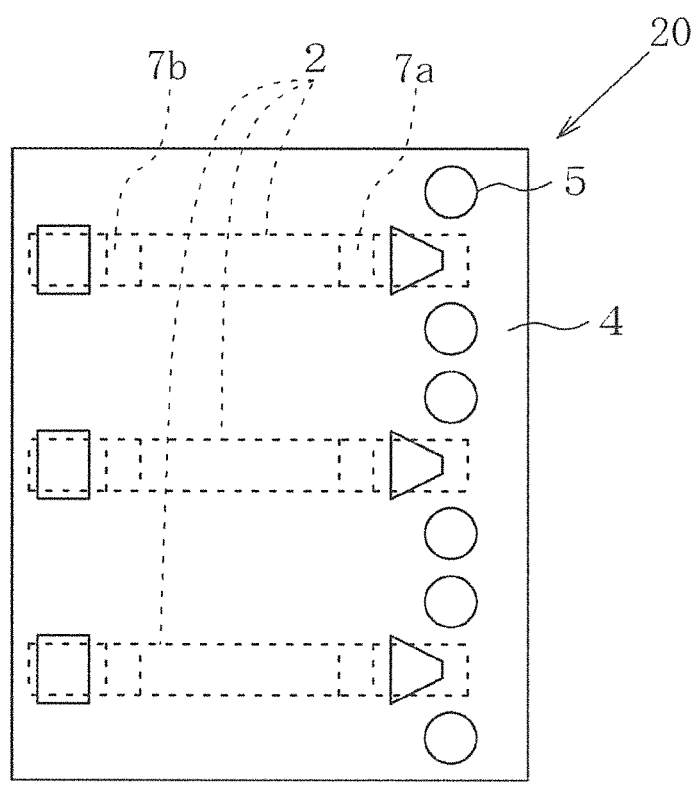
FIG. 6 is a schematic plan view illustrating still another embodiment of the optical waveguide according to the present disclosure.

While the embodiment has been described in connection with the case in which one optical waveguide 20 includes one core 2, one optical waveguide 20 may include a plurality of cores 2 as illustrated in FIG. 6. Such a case is advantageous in further increasing the functionality of the optical waveguide 20 and the optical circuit board 40 because a larger number of optical signals can be transferred.

While the embodiment has been described in connection with an example in which the wiring board 30 does not include a solder resist layer, the wiring board 30 may include solder resist layers on both or either one of upper and lower surfaces of the insulating substrate 31, the solder resist layers including openings where the second pads 36 and the third pads 37 are exposed. With the presence of the solder resist layers, damage of the wiring conductors 32 can be suppressed, the damage being caused, for example, by heat treatment performed when the electronic component S is mounted. The openings in each solder resist layer may have different shapes from one another. The opening having the different shapes can also be used as alignment marks, for example, when the electronic component S is mounted.

Figure 7:
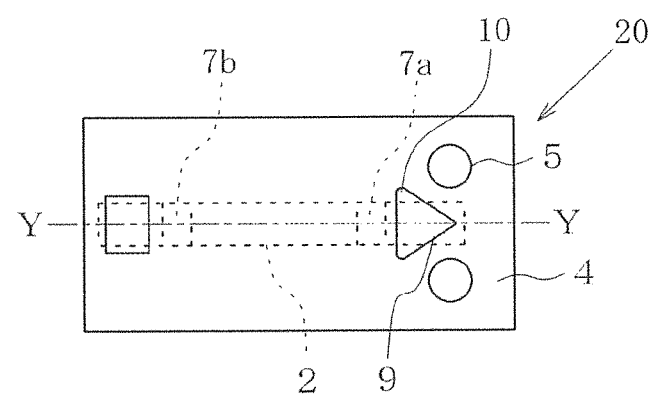
FIG. 7 is a schematic plan view illustrating still another embodiment of the optical waveguide according to the present disclosure.

As illustrated in FIG. 7, in the cavity 6, a corner portion 10 of the opening 9 may have a curved shape when viewed in plan. The radius of curvature of the corner portion 10 is set to about 5 to 10 μm, for example. In such a case, stress generated in the corner portion 10 upon the optical waveguide 20 receiving external pressure or heat can be reduced to 40 to 60%. As a result, cracking of the laminate 4 in the corner portion 10 can be suppressed, and the highly-functional optical waveguide 20 can be obtained with good reliability.

Figure 8:
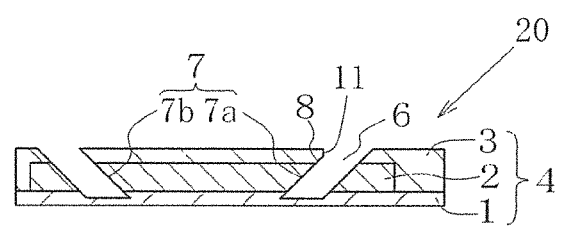
FIG. 8 is a schematic sectional view illustrating still another embodiment of the optical waveguide according to the present disclosure.

As illustrated in FIG. 8, the cavity 6 may include a lateral surface 11 spanning from the upper surface of the upper cladding 3 to the sectional surface 8 including the reflective surface 7, the lateral surface 11 intersecting each of the upper surface of the upper cladding 3 and the sectional surface 8 at an angle of 90 degrees or larger when viewed in cross-section. In such a case, since there is no longer present a portion where the upper surface of the upper cladding 3 and the sectional surface 8 including the reflective surface 7 intersect at an acute angle, it is possible to suppress chipping of the laminate 4, and to avoid cracking caused by the chipping from reaching the reflective surface 7. As a result, the optical waveguide 20 can be obtained as an optical waveguide capable of accurately changing the direction of an optical signal and exhibiting good transmission characteristics.

An upper limit value of the angle at which the lateral surface 11 intersects the upper surface of the upper cladding 3 and an upper limit value of the angle at which the lateral surface 11 intersects the sectional surface 8 including the reflective surface 7 depend on the angle at which the upper surface of the upper cladding 3 intersects the sectional surface 8 including the reflective surface 7. When the angle at which the upper surface of the upper cladding 3 intersects the sectional surface 8 including the reflective surface 7 is 45 degrees, for example, the above-mentioned upper limit value is 135 degrees.

The above-described corner portion 10 and lateral surface 11 each having the curved shape is formed, for example, by applying, after forming the cavity 6, a laser beam to a region where the upper surface of the upper cladding 3 intersects the sectional surface 8 including the reflective surface 7.

Regarding the cavity 6, the structure in which the corner portion 10 of the opening 9 has the curved shape, and the structure in which each of the angles of the lateral surface 11 intersecting the upper surface of the upper cladding 3 and the sectional surface 8 is 90 degrees or larger when viewed in cross-section can be formed at the same time as when carrying out the above-described laser processing. The optical waveguide 20 may include both of the above-mentioned structures.

What is claimed is:

1. An optical waveguide comprising:
   a laminate including a lower cladding, a core on the lower cladding, and an upper cladding positioned on the lower cladding and covering the core;
   via holes positioned in the laminate in a spaced opposing relation to each other;
   a cavity positioned over a span from an upper surface of the upper cladding to the lower cladding, the cavity including a sectional surface sectioning the core obliquely relative to the upper surface of the upper cladding; and
   a reflective surface positioned in the core and defined by part of the sectional surface,
   wherein the cavity extends from a region between the via holes in the spaced opposing relation toward outside of the region, and
   an opening size of the cavity in the region is smaller than an opening size of the cavity outside the region when viewed in an opposing direction of the via holes.

2. The optical waveguide according to claim 1, wherein an opening of the cavity has a triangular shape with one of three apexes being positioned in the region.

3. The optical waveguide according to claim 2, wherein, outside the region, a corner portion of the opening of the cavity has a curved shape when viewed in plan.

4. The optical waveguide according to claim 1, wherein the cavity includes a lateral surface spanning from the upper surface of the upper cladding to the sectional surface including the reflective surface, the lateral surface intersecting each of the upper surface of the upper cladding and the sectional surface at an angle of 90 degrees or larger when viewed in cross-section.

5. An optical circuit board comprising:
   the optical waveguide according to claim 1; and
   a wiring board including pads on a surface of the wiring board at intervals between the pads,
   wherein the optical waveguide is positioned on the wiring board in a state of the pads being positioned just under lower openings of the via holes.

* * * * *